United States Patent [19]

Ehni

[11] Patent Number: 4,500,845
[45] Date of Patent: Feb. 19, 1985

[54] PROGRAMMABLE ATTENUATOR
[75] Inventor: George J. Ehni, Dallas, Tex.
[73] Assignee: Texas Instruments Incorporated, Dallas, Tex.
[21] Appl. No.: 475,573
[22] Filed: Mar. 15, 1983
[51] Int. Cl.³ .............................................. H03G 3/30
[52] U.S. Cl. ....................................... 330/86; 330/282; 330/277; 330/284; 330/307; 333/81 R
[58] Field of Search ............... 330/277, 282, 284, 286, 330/307, 86; 333/81 R; 307/553, 554, 568

[56] References Cited

U.S. PATENT DOCUMENTS 4,070,632  1/1978  Tuttle .................................... 330/86
4,143,383  3/1979  Van Rooij et al. ............... 333/81 R
4,354,159  10/1982 Schorr et al. ..................... 333/81 R Primary Examiner—James B. Mullins
Assistant Examiner—Steven J. Mottola
Attorney, Agent, or Firm—Richard A. Bachand; N. Rhys Merrett; Melvin Sharp

[57] ABSTRACT

An integratable programmable attenuator includes in one embodiment a plurality of field-effect transistors coupled to a semiconductor resistor at spaced apart locations thereon, the semiconductor resistor forming one of the source/drain regions of each of the transistors. The other source/drain region of each field-effect transistor is selectively coupled to an input of a differential amplifier, the output of which is coupled to one end region of the semiconductor resistor. The gain of the differential amplifier is variable in predetermined steps according to which of the transistors is selected.

12 Claims, 5 Drawing Figures

4,500,845

PROGRAMMABLE ATTENUATOR

BACKGROUND OF THE INVENTION

The present invention relates generally to semiconductor integrated circuit devices and more particularly to an integrated programmable attenuator.

In many circuit applications it is necessary to vary the gain of an amplifier. For example, in the telecommunications field each transmit and receive circuit is coupled to an amplifier whose gain is adjusted to compensate for the attenuation characteristics of the transmission medium. Further, the amplifiers must be readjusted if the characteristics change significantly.

The simplest means of adjusting the gain of an amplifier 10, referring to FIG. 1, is to connect a continuously variable resistance 12 in the amplifier feedback circuit. The gain of the amplifier is approximately equal to the negative ratio of the feedback resistance to the input resistance, i.e., $-(R_F R_I)$. The continuously variable resistance is typically a mechanical potentiometer, which is subject to mechanical wear and is a source of noise in a telecommunications system. Further, the amplifier gain must be manually reset each time the need arises.

In another circuit shown in FIG. 2, a series of resistors $R_A$-$R_D$ are connected to the input and feedback resistors $R_I$ and $R_F$ and coupled through a switch 14 to an amplifier 16. The gain of amplifier 16 may thus be varied in discrete steps. For example, the gain of amplifier 16 with switch 14 in the position shown is approximately $-(R_F+R_B+R_C+R_D)/(R_I+R_A)$. However, the implementation of this circuit with discrete components has many of the shortcomings of the previously described circuit.

SUMMARY OF THE INVENTION

Accordingly, the present invention overcomes many of the disadvantages of prior attenuators by providing a programmable attenuator completely integratable in a semiconductor device.

In one embodiment of the invention a plurality of field-effect transistors (FETs) are coupled to a semiconductor resistor at spaced apart locations thereon, with the semiconductor resistor forming one of the source/drain regions of each of the FETs. The other source/drain region of each FET is selectively coupled to one input of a differential amplifier, with the other input of the differential amplifier connected to a ground node. The output of the differential amplifier is coupled to one end region of the semiconductor resistor and forms the output of the attenuator. The gain of the differential amplifier varies according to which of the FETs is selected.

In another embodiment of the present attenuator the semiconductor resistor has a serpentine configuration and is superimposed on an array of rows and columns of FETs. The gates of all FETs in a column are formed of a common region which is coupled to column select means, and the second source/drain regions of all FETs in a row are coupled to row select means which are coupled to the differential amplifier input. The gain of the amplifier is thus programmable or selectable by enabling a single column and a single row.

In yet another embodiment of the invention the dimensions of the semiconductor resistor are selected so that the gain of the differential amplifier is varied in substantially equal steps.

BRIEF DESCRIPTION OF THE DRAWINGS

Other objects and many of the attendant advantages of the present invention will become apparent, and the invention will be better understood by reference to the following detailed description and appended claims when read in conjunction with the accompanying drawings, wherein:

DETAILED DESCRIPTION OF THE PREFERRED EMBODIMENTS

Figure 3:
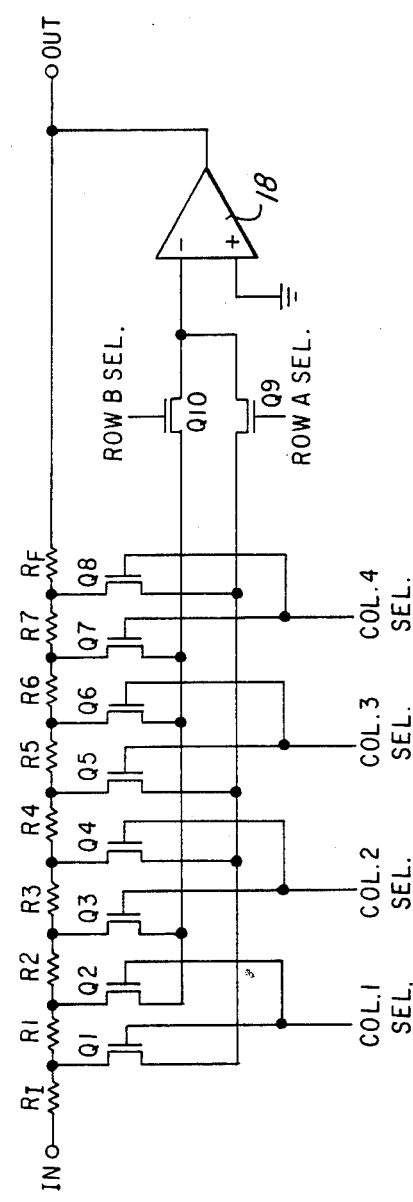
FIG. 3 is schematic diagram of a programmable attenuator according to one embodiment of the present invention.

Referring now to the drawings, there is shown in FIG. 3 a schematic diagram of a programmable attenuator according to one embodiment of the present invention wherein the output of a differential amplifier 18 is connected to one terminal of a resistor $R_F$, which is one of a plurality of resistors $R_F$, $R_I$, R1-R7 in the feedback circuit of amplifier 18. One terminal of $R_I$ forms the input of the present attenuator and the output of amplifier 18 forms the attenuator output. The nodes between the plurality of resistors are connected to a plurality of switch means, for example, the source/drain regions of a plurality of FETs Q1-Q8. The other source/drain region of each FET is connected to one of two select transistors Q9 or Q10 whose outputs are coupled to the inverting input of amplifier 18. The noninverting input of amplifier 18 is connected to ground, and the gates of Q1-Q8 are connected to one of four select lines COL. 1-COL. 4.

A particular number of resistors R1-R7, FETs Q1-Q10 and select lines COL. 1-COL. 4 and ROW A, ROW B, are shown in FIG. 3 by way of example only. Those skilled in the art will understand that any number of resistors and FETs may be chosen depending upon the desired number of amplifier 18 gain steps.

In operation, the gain of amplifier 18 is determined or selected by properly biasing the gate, i.e., by turning on one of the FETs Q1-Q8 and coupling the source/drain region of the selected FET to amplifier 18. This is accomplished by simultaneously enabling one of the select lines COL. 1-COL. 4 and one of the select lines ROW A or ROW B, which are connected to the gates of FETs Q9 and Q10, respectively. For example, if the minimum amplifier gain is required, select lines ROW A and COL. 4 are enabled. This causes both Q7 and Q8 to conduct, but only the output of Q8 is coupled to the input of amplifier 18 through Q9. The gain of the amplifier in this case is given by the expression $$A_{min} = -R_F/(R_I + R1 + \ldots R7)$$

Similarly, if the maximum gain is required, select lines ROW A and COL. 1 are enabled, causing the output of Q1 to be coupled to amplifier 18 through Q9 and resulting in a gain of $$A_{max.} = -(R_F + R1 + \ldots + R7)/R_I$$

Intermediate gain steps are selected by selectively turning on the remaining transistors Q2–Q7 and Q9 or Q10, i.e., by enabling the other combinations of select lines ROW A, ROW B, and COL. 1–COL. 4. The gain at each step is related to the relative size of the resistors.

Figure 1:
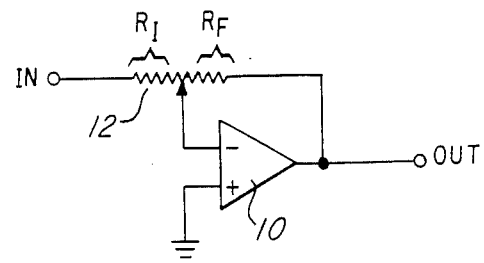
FIG. 1 is a schematic diagram of a continuously variable gain amplifier circuit.
Figure 2:
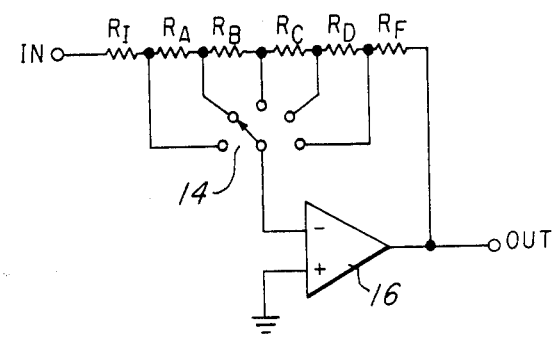
FIG. 2 is a schematic diagram of a discretely variable gain amplifier circuit.
Figure 5:
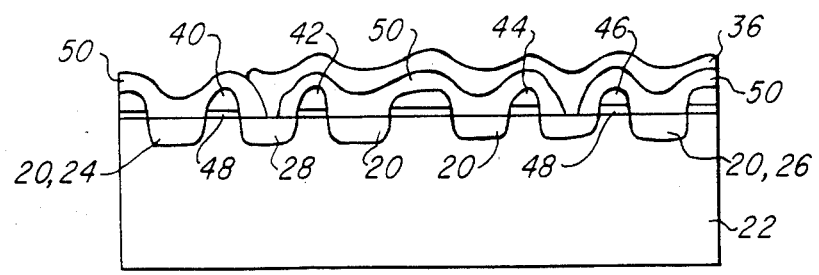
FIG. 5 is a cross-sectional view in elevation taken along line 5—5 in FIG. 4.
Figure 4:
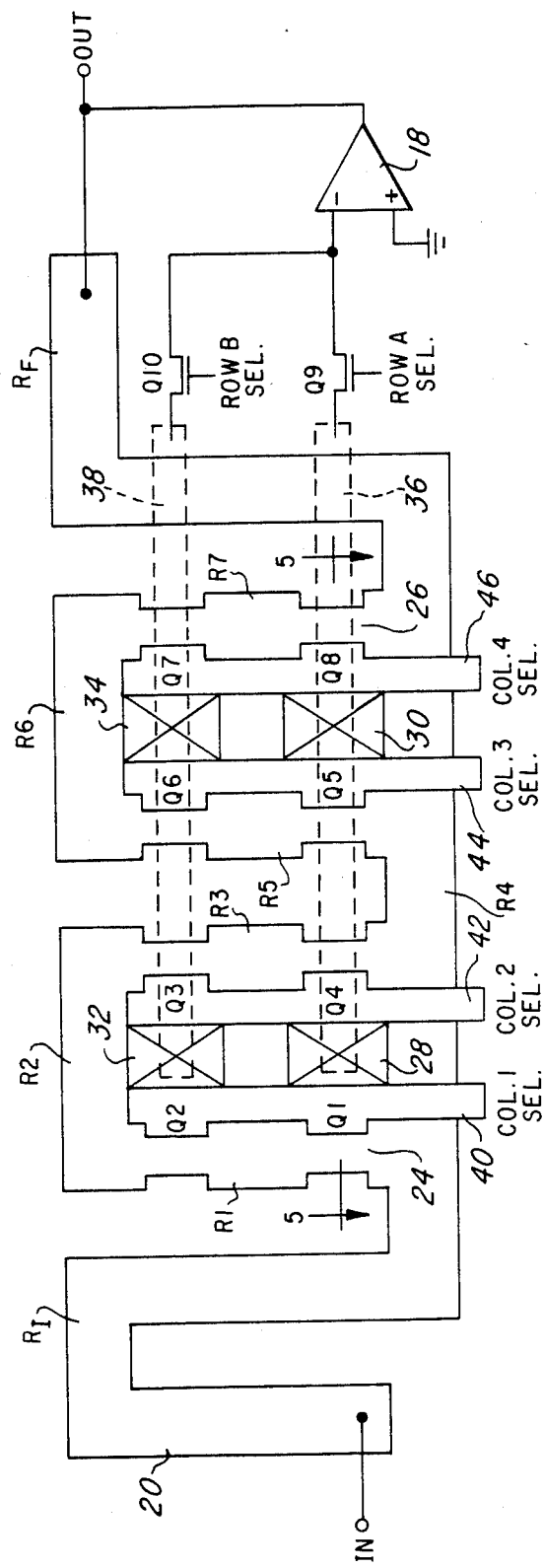
FIG. 4 is a partial schematic, partial plan view of the attenuator of FIG. 3.

Referring now to FIGS. 4 and 5, there is shown one embodiment of a semiconductor device to perform the function of the circuit of FIG. 3. Resistors $R_I$, $R_F$, and R1–R7 are formed of an elongated P-type region 20 in an N-type semiconductor layer 22. Region 20 is conveniently formed by a boron implant and has a resistivity of approximately 50–100 ohms/square. A serpentine configuration of P-type region 20 is particularly advantageous in that transistors Q1–Q8 may be interlaced therein in an array of rows and columns. In this manner region 20 forms one of the source/drain regions of each of the transistors Q1–Q8 in addition to forming the series of resistors $R_I$, $R_F$ and R1–R7. For example, the segment 24 of region 20 forms the souce/drain region of Q1 and the segment 26 of region 20 forms the source/drain region of Q8. A P-type region 28 between Q1 and Q4 and spaced apart from region 20 forms the second source/drain region for both Q1 and Q4. Similarly, P-type regions 30, 32, and 34 form common source/drain regions between transistors Q5–Q8, Q2–Q3, and Q6–Q7, respectively. Regions 28 and 30 are connected by a conductor 36 to transistor Q9 which couples the outputs of Q1, Q4, Q5 and Q8 to amplifier 18 when ROW A is selected, by properly biasing the gate of Q9. Regions 32 and 34 are connected by a conductor 38 to transistor Q10 which couples the outputs of Q2, Q3, Q6 and Q7 to amplifier 18 when the ROW B select line is enabled.

A polysilicon region 40 overlying the channel between regions 24 and 28 forms the gates of Q1 and Q2, and also the COL. 1 select line. In a similar manner, polysilicon regions 42, 44 and 46 form select lines COL. 2, COL. 3 and COL. 4, as well as the gates of Q3–Q4, Q5–Q6, and Q7–Q8, respectively. Regions 40-46 are separated from the surface of layer 22 by a gate oxide layer 48. As best seen in FIG. 5, an oxide layer 50 formed over the surface of the structure has apertures therein for conductors 36 and 38 to contact the common source/drain regions of transistors Q1–Q4, Q2–Q3, Q6–Q7, and Q5–Q8.

The selected values of resistors $R_I$, $R_F$, and R1–R7 are obtained by adjusting the dimensions of region 20. In one embodiment the width of region 20 is reduced to obtain the required resistor value. Alternatively, the length of region 20 may be varied to achievea similar result.

In another embodiment of the invention the values of the resistors are selected so that the incremental gain steps of amplifier 18 are substantial equal as successive transistors are selected. By way of illustration, assume that it is required to have an amplifier with a minimum gain of −3 db., a maximum gain of +4 db., and seven equal intermediate gain steps of 1 db. each. Further, assume a nominal resistance of about 200 ohms for R1–R7. The required values of the resistors are determined by an iterative solution of the amplifier gain equation set forth hereinabove. The resistor values for this example, in ohms, are set forth below.

$R_I = 2763.3$
$R_1 = 197.4$
$R_2 = 201.3$
$R_3 = 204.0$
$R_4 = 205.4$
$R_5 = 205.4$
$R_6 = 204.0$
$R_7 = 201.3$
$R_F = 2960.7$

Thus, there is provided by the present invention a programmable attenuator which may be included in an integrated circuit device and which occupies a minimum of surface area thereon.

Other embodiments and modifications of the present invention will readily come to those skilled in the art having the benefit of the foregoing description and drawings. It is therefore to be understood that such modifications are intended to fall within the spirit and scope of the appended claims.

What is claimed is:

1. A programmable attenuator comprising:
    resistance means, wherein said resistance means is an elongated region of one conductivity type in a semiconductive layer of the opposite conductivity type;
    differential amplifier means having an output coupled to one terminal of said resistance means and a noninvering input coupled to a ground node;
    a plurality of switch means each coupled to said resistance means at one of a plurality of spaced apart locations along the length thereof, wherein said switch means are field-effect transistors, and wherein said region of said one conductivity type forms a first source/drain region of said field effect transistors; and means to selectively couple each of said switch means to an inverting input of said differential amplifier means, wherein the selection of each of said switch means causes a predetermined change in the gain of said differential amplifier means.

2. The attenuator of claim 1 wherein said elongated region has a serpentine configuration and said field-effect transistor means are arranged in an array of rows and columns interleaved therewith.

3. The attenuator of claim 2 wherein the width of said elongated region adjacent each of said field-effect transistor means is related to a predetermined incremental change in resistance of said resistance means.

4. The attenuator of claim 3 wherein said selective coupling means comprises row select means and column select means.

5. The attenuator of claim 4 wherein the gates of each column of field-effect transistor means are coupled together and to said column select means.

6. The attenuator of claim 5 wherein the second source/drain region of each row of field-effect transistor means are coupled together and to said row select means.

7. A programmable attenuator comprising:
    resistance means, wherein said resistance means is a region of one conductivity type in a semiconductor layer of the opposite conductivity type, and wherein said resistance means has a generally serpentine configuration;
    an array of rows and columns of field effect transistor switches interleaved with said resistance means, each of said transistor switches being coupled to said resistance means at one of a plurality of spaced apart locations along the length thereof, each of said locations dividing said resistance means into a first segment and a second segment, wherein the selection of each successive switch means causes a predetermined logarithmic change in the ratio of the resistance of said first segment to the resistance of said second segment, and wherein said region of said one conductivity type forms one source/drain region of each of said field-effect transistor switches; and row select means coupled to the output of each row of said transistor switches; and column select means coupled to the outputs of each column of each transistor switches.

8. The attenuator of claim 7 wherein each column select means comprises the gates of said field-effect transistor means in one of said columns.

9. The attenuator of claim 8 wherein each row select means comprises the second source/drain regions of each of said field-effect transistor means in one of said rows.

10. The attenuator of claim 9 wherein the width of said region of said one conductivity type adjacent each of said field-effect transistor means is related to a predetermined incremental change in resistance of said resistance means.

11. The attenuator of claim 10, further including:
differential amplifier means having inverting and noninverting inputs and an output, wherein said row select means are coupled to said inverting input, one terminal of said resistance means is coupled to said output, and said noninverting input is coupled to a ground node, and wherein said differential amplifier means output forms the output of said attenuator.

12. The attenuator of claim 11 wherein the incremental change in resistance of said resistance means between each successive field-effect transistor means causes a substantially equal change in the gain of said differential amplifier means.

* * * * *